United States Patent [19]

Chandross et al.

[11] Patent Number: 4,708,884
[45] Date of Patent: Nov. 24, 1987

[54] LOW TEMPERATURE DEPOSITION OF SILICON OXIDES FOR DEVICE FABRICATION

[75] Inventors: Edwin A. Chandross, Berkeley Heights; Robert E. Dean, High Bridge; Patrick K. Gallagher, Basking Ridge; Roland A. Levy, Berkeley Heights; Frank Schrey, Neshanic Station; Gerald Smolinsky, Madison, all of N.J.

[73] Assignee: American Telephone and Telegraph Company, AT&T Bell Laboratories, Murray Hill, N.J.

[21] Appl. No.: 875,475

[22] Filed: Jun. 18, 1986

Related U.S. Application Data

[63] Continuation-in-part of Ser. No. 722,433, Apr. 15, 1985, Pat. No. 4,597,985, which is a continuation of Ser. No. 629,950, Jul. 11, 1984, abandoned.

[51] Int. Cl.$^4$ .............................................. B05D 3/14
[52] U.S. Cl. ......................................... 427/39; 427/51
[58] Field of Search .............................. 427/39, 93, 51

[56] References Cited

U.S. PATENT DOCUMENTS

| | | | |
|---|---|---|---|
| 2,566,956 | 9/1951 | Pedlow et al. | 556/484 |
| 3,655,438 | 4/1972 | Sterling et al. | 427/35 |
| 4,597,985 | 7/1986 | Chandross et al. | 427/39 |

*Primary Examiner*—Thurman K. Page
*Assistant Examiner*—Leon R. Horne
*Attorney, Agent, or Firm*—Peter A. Businger

[57] ABSTRACT

Conformal layers of a silicon oxide, such as silicon dioxide, are deposited at temperatures below 600 degrees C. through the decomposition of compounds such as diacetoxyditertiarybutoxysilane. The required temperatures do not significantly affect temperature-sensitive structures. Therefore, it is possible to form silicon oxide regions in the processing of devices having these structures. More generally, lowered-temperature processing can be applied to the deposition of other materials which include silicon oxide. For example, borophosphosilicate glasses can be deposited by chemical vapor deposition processing involving flash-evaporation of a mixture of liquid precursor reagents.

15 Claims, 4 Drawing Figures

LOW TEMPERATURE DEPOSITION OF SILICON OXIDES FOR DEVICE FABRICATION

CROSS-REFERENCE TO RELATED APPLICATION

This is a continuation-in-part application of application Ser. No. 722,433, filed Apr. 15, 1985 now U.S. Pat. No. 4,597,985, which is a continuation application of application Ser. No. 629,950, filed July 11, 1984 now abandoned which is incorporated herein by reference.

BACKGROUND OF THE INVENTION

1. Field of the Invention

This invention relates to the fabrication of devices and, in particular, the fabrication of devices that include a silicon oxide region.

2. Art Background

In the fabrication of devices such as semiconductor devices, a variety of material layers is sequentially formed and processed on a substrate. (For the purpose of this disclosure, the substrate includes a bulk material such as 1) a pyroelectric, e.g., LiNbO$_3$ or 2) a semiconductor, e.g., silicon, body and, if present, various regions of materials such as dielectric materials, metallic materials, and/or semiconductor materials). Often, one of the material regions utilized in this fabrication procedure includes a silicon oxide, i.e., a material nominally represented by the formula SiO$_n$ where $0 < n \leq 2$. For example, silicon oxide regions are utilized as passivating layers, as electrical insulation between conducting layers, e.g., metal layers, and as a cap for doped semiconductor layers to limit unacceptable dopant migration during subsequent processing.

A silicon oxide is often deposited on a non-planar substrate surface having a plurality of steps (6 in FIG. 1). It is desirable that the deposited silicon conformally coat this non-planar surface. If a conformal silicon oxide layer is not achieved, an irregular coating, 18, forms over the underlying steps, 12. If deposition is continued, voids, 10, as shown in FIG. 2, are often produced. An irregular coating such as shown in FIG. 1 is, in many situations, unacceptable because a non-planar surface degrades the resolution of subsequent photolithography. Voids such as shown in FIG. 2 are even less desirable because etching and dielectric properties will be nonuniform. In either case, lack of planarity generally produces difficulties in subsequent processing. Therefore, it is very desirable to produce a conformal coating. (Conformance is measured by two ratios, i.e., (1) the ratio between dimension s (FIG. 3) and dimension t and (2) the ratio between dimension b and dimension t. Both ratios should be in the range 0.9 to 1.0 for a layer to be considered conformal.)

Although silicon oxide conformal coatings are very difficult to produce, one process generally denominated, the TEOS (tetraethoxysilane) process, leads to a silicon oxide region having ratios of approximately 0.9 for 1.0 μm-dimension steps. This process involves flowing tetraethoxysilane over a heated deposition substrate and thus causing pyrolysis of the compound with the resulting formation of silicon oxide. However, the decomposition of the tetraethoxysilane must be performed at temperatures of approximately 700 degrees C. or higher to achieve an acceptable silicon oxide deposition rate, i.e., a rate greater than 10 Angstroms/minute. (Phosphorus oxide doping of silicon oxide formed from TEOS allows deposition at temperatures down to 650 degrees C.). However, device structures, e.g., LiNbO$_3$/silicon interfaces, doped silicon regions, and aluminum/silicon interfaces, which cannot tolerate nominal exposure to temperatures above 500 degrees C. are common, and this sensitivity severely limits the usefulness of the TEOS process.

Lower temperature processes for depositing silicon oxides are available. Exemplary of such processes is the reaction of silane and oxygen at about 400 degrees C. Although temperatures of 400 degrees C. do not substantially affect aluminum or doped semiconductor materials, the resulting silicon oxide region contains particulate matter and is extremely non-conformal, exhibiting ratios less than 0.5. Not only are the previously discussed difficulties relating to non-conformal surfaces present, but also the particulate matter causes non-uniform etching and electrical properties. Thus, an acceptable low temperature procedure for forming a conformal region of a silicon oxide has not been reported.

SUMMARY OF THE INVENTION

A conformal region (film) of a silicon oxide is produced by decomposing (1) a diacetoxysilane compound represented by the formula (RO)$_2$Si(OAc)$_2$ where R is a tertiarybutyl (DADBS) or isopropyl (DADIS) moiety, or by decomposing (2) tritertiarybutoxyethoxysilane (TBES), in the vicinity of a substrate by, for example, heating the substrate or introducing a plasma. When substrate heating is employed, the TBES causes deposits at a rate faster than 17 Angstroms/minute for temperatures of approximately 550 degrees C., DADIS leads to a deposition rate of approximately 10 Angstroms/minute at 550 degrees C., while a rate faster than 50 Angstroms/minute is achieved with the DADBS for temperatures in the range of 410 degrees C. to 550 degrees C. Use of a plasma yields significantly greater deposition rates at substrate temperatures of approximately 350 degrees C. Thus, a conformal coating is obtainable at a temperature which allows the processing of substrates containing temperature-sensitive structures.

DETAILED DESCRIPTION

Figure 1:
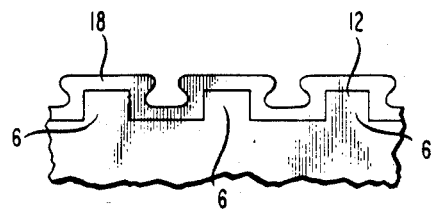
FIGS. 1, 2, and 3 are illustrative of device structures obtainable.
Figure 2:
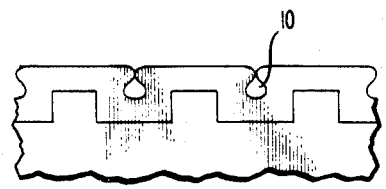
Figure 3:
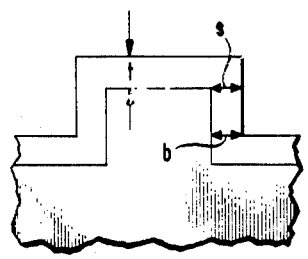

A silicon oxide deposited region is produced by decomposing either diacetoxyditertiarybutoxysilane (DADBS), diacetoxydiisopropoxysilane (DADIS), tritertiarybutoxyethoxysilane (TBES), or a combination of these compositions in the presence of a deposition substrate. Decomposition is induced by, for example, striking a plasma in a gas containing the appropriate silanes and/or by heating the substrate. Suitable decomposition temperatures are generally provided by heating the substrate to a suitable temperature utilizing conventional techniques, e.g., resistance heating. Suitable deposition rates are obtainable with temperatures below 600 degrees C. The synthesis of DADBS is explicitly disclosed in U.S. Pat. Nos. 2,566,956 and 2,566,957, issued Sept. 4, 1951. The synthesis of TBES is possible by reacting (tBuO)$_3$SiCl (whose synthesis is also disclosed in these patents) with ethanol in the presence of pyridine. The synthesis of DADIS is possible by analogy to DADBS as disclosed in these patents, except initially isopropyl alcohol, rather than t-butyl alcohol, is reacted with SiCl₄.

In one embodiment, the deposition compound is continuously flowed over a heated substrate. It is possible to utilize either a flow containing only the desired compound or a flow including both the desired compound and a source of oxygen. Although the oxygen is not essential, typically it helps limit stress in the deposited silicon oxide. Generally, partial pressures of the DADBS, DADIS, or TBES in the range 0.3 Torr to 1.0 Torr are utilized. At partial pressures less than 0.3 Torr, when a plurality of substrates is being treated, the uniformity from substrate to substrate is substantially degraded. At pressures greater than 1.0 Torr, the rate of deposition is significantly decreased, and the thickness uniformity of the deposited silicon oxide over each substrate is also substantially reduced. Therefore, although partial pressures outside this range are not precluded, they are generally undesirable. Generally, oxygen partial pressures less than 0.3 Torr are employed. Partial pressures greater than 0.3 Torr are undesirable because the rate of oxide deposition is substantially reduced due to dilution of the silane.

The rate of flow for the gas containing DADBS, DADIS, TBES, or a combination of these compositions should be in the range of 5 sccm to 20 sccm. At flow rates less than 5 sccm or greater than 20 sccm, the deposition rate is substantially decreased. Additionally, it is desirable, although not essential, to limit the thickness of the deposited layer to avoid cracks in the deposited layer when decomposition is induced solely by heating the substrate. The thickness deposited depends on the decomposition and the composition of the substrate. For a silicon substrate, temperatures of 450 degrees C. allow thicknesses up to 6000 Angstroms, while temperatures of 550 degrees C. allow thicknesses up to 2 $\mu$m without cracking. Additionally, the presence of oxygen advantageously augments thicknesses at lower temperatures. For example, with oxygen at 450 degrees C., cracks are avoided up to a thickness of approximately 1 $\mu$m. If greater thicknesses are desired, it is possible to augment the thickness produced through the inventive process by other low temperature procedures such as plasma-enhanced CVD and/or to induce the decomposition with a plasma. The use of an augmentation procedure is not typically undesirable since the inventive process allows planarization of typical steps found in substrates by deposition of a conformal layer having suitable thickness. Thus, augmentation of this planarized surface with a second procedure which is not necessarily conformal does not cause degradation of the conformal region.

In another embodiment, a silicon oxide region is deposited by subjecting the substrate to either DADIS, DADBS, TBES, or a combination of these compositions in the presence of a plasma. The conditions utilized for this procedure are those typically employed in plasma-assisted CVD processes (See VLSI Technology, S. M. Sze, McGraw-Hill, New York, 1983, for an extensive review of conditions and procedures utilized in plasma-assisted deposition procedures.) Unlike other plasma-assisted procedures directed to the deposition of silicon oxide, the use of DADIS, DADBS, TBES, or a combination of these compositions leads to a conformal coating. For such deposition, the substrate is advantageously kept at a nominal temperature, e.g., 350 degrees C., to ensure the growth of high-quality films. Generally, the diacetoxy and/or TBES-containing composition is employed at a partial pressure in the range 0.8 Torr to 1.0 Torr. It is possible to dilute this composition with a source of oxygen and/or an inert gas, e.g., argon, to yield a total pressure in the range 1.0 Torr to 1.2 Torr. Plasma power densities in the range 0.08 W/cc to 0.1 W/cc lead to suitable decomposition and the desired deposition.

It has also been found that lowered-temperature processing is of interest for the deposition of materials containing one or several additional components. Of particular interest in this respect are dielectric coatings made of silicate glasses which may include, for example, boron oxide, phosphorus oxide, arsenic oxide, germanium oxide, or aluminum oxide. Such additional or dopant components may be added for a variety of reasons such as, e.g., the reduction of stress in a deposited layer, the gettering of undesired ions, and the enhancement of flow characteristics. Preferably, silicon oxide is included in a silicate glass layer in an amount of at least 50 weight percent, this in the interest of preventing devitrification and phase separation in the layer or corrosion of overlying metallization.

Exemplary of contemplated applications is the desire for conformal dielectric coatings of borophosphosilicate glass in silicon and lithium-niobate device manufacture. Compositions containing approximately 13 weight percent $B_2O_3$, 9 weight percent $P_2O_5$, and remainder essentially $SiO_2$ are particularly advantageous as based on considerations of viscosity and chemical stability. Glasses of this type preferably comprise $B_2O_3$ in an amount of at least 3 weight percent, and $P_2O_5$ in an amount of at least 2 weight percent, this in the interest of desired viscosity and flow characteristics. Also, such glasses preferably comprise $B_2O_3$ in an amount not exceeding 26 weight percent, and $P_2O_5$ in an amount not exceeding 18 weight percent, such preferred upper limits being recommended in the interest of chemical stability and the prevention of devitrification in a humid atmosphere. More detailed information concerning these and similar glass compositions can be found in the paper by K. Nassau et al., "Modified Phosphosilicate Glasses for VLSI Applications", Journal of the Electrochemical Society: Solid-State Science and Technology, Vol. 132 (1985), pp. 409–415.

Materials containing silicon oxide such as, e.g., silicate glasses can be made by admixing desired additives to DADBS, DADIS, or TBES, preferably in organoderivative form. Mixing may be applied either to gaseous reagents or, preferably, to reagents in liquid form—followed by flash evaporation of the mixture of liquids. For example, for lowered-temperature deposition of borophosphosilicate glass, trimethyl borate (TMB) and trimethyl phosphite (TMP) are conveniently admixed to DADBS, and, upon vaporization of the mixture, a vapor stream is obtained from which glass can be deposited on a substrate. Particularly suitable for admixing to DADBS, DADIS, or TBES in the deposition of borophosphosilicate glass are organophosphites, organophosphates, and organoborates.

Among advantages of deposition based on the use of DADBS, DADIS, or TBES, in combination with a liquid precursor additive, is the ease with which glass composition is controllable by mixing of precursors in liquid form. Complete (flash) evaporation of the mixture eliminates concern with the influence of temperature and pressure variations on vapor stream composition, the composition of the gaseous mixture being substantially the same as the composition of the liquid mixture prior to evaporation. Not precluded, nevertheless, is the addition of gaseous flow components to the vapor stream, e.g., as a carrier gas or in order to provide additional oxygen to the chemical vapor deposition reactor.

As described, composition of the gaseous reagent flow can be precisely controlled by adjusting the composition of a liquid mixture. However, the relationship between the composition of the gaseous mixture and that of the deposited glass still depends on a number of deposition parameters such as, e.g., vapor stream flow rate, deposition temperature, and deposition pressure. Thus, in the interest of uniformity of deposition when premixed reagents are used, such parameters are preferably held constant during deposition processing. As an alternative to premixing, liquid reagents may be metered individually, followed by admixing either before, during, or after flash evaporation. In this case, metering may by be under process control as based, e.g., on conditions sensed in the deposition chamber.

Specifically with respect to the deposition of phosphosilicate glass, a significant benefit realized on account of lowered-temperature processing lies in improved uniformity of deposition rate and constancy of phosphorus concentration when such glass is deposited from a mixture including TMP and DADBS, DADIS, or TBES. As a result, deposition may extend over a considerable reaction zone distance without undue variability of glass composition, allowing for simplified reaction chamber design and convenient processing of batches of device wafers.

The following examples are illustrative of the invention.

EXAMPLE 1

Figure 4:
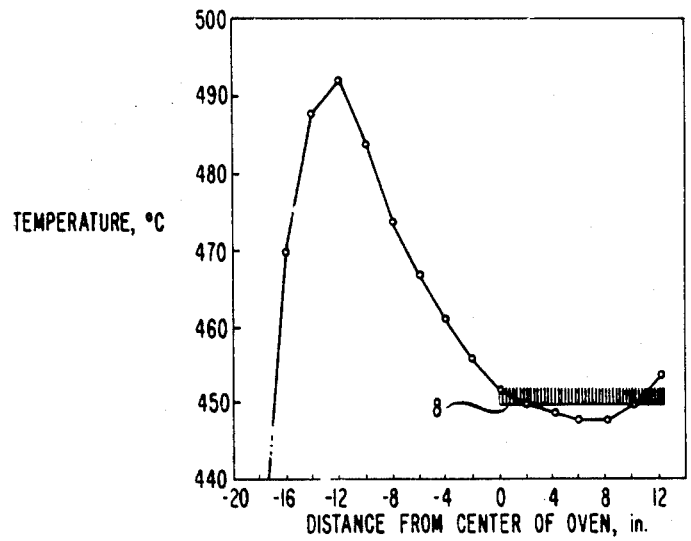
FIG. 4 is illustrative of conditions useful in the invention.

A 3-zone quartz oven (5 inches in diameter) was heated so that the first zone (10 inches in length) was at 510 degrees C., the second zone was at 450 degrees C., and the third zone was at 450 degrees C. The temperature profile obtained for these zone settings is shown in FIG. 4. A sample holder was filled with 50 silicon substrates (4 inches in diameter) having their major plane in the <100> crystallographic direction. These 50 substrates were loaded into the sample holder so that they were evenly distributed along 12 inches in the direction of the oven axis and so that they were held with their major surface perpendicular to the major axis of the oven. The sample holder was inserted into the oven at the position indicated as 8 in FIG. 4. The oven was evacuated to a pressure of approximately 0.005 Torr. Approximately 300 ml of DADBS (purchased from Petrarch Systems, Inc.) was placed in a 500 ml round-bottom flask which was out-gassed and held at a temperature between 75 degrees C. and 80 degrees C. and having flow access to the oven. The resulting vapor was metered into the reactor through a heated mass flow controller to produce a flow rate of 8 sccm. The pumping speed of the vacuum pump utilized to evacuate the oven was controlled so that a reactor pressure of approximately 0.7 Torr was maintained. After 60 minutes, the flow of DADBS was then discontinued and the oven evacuated and then back-filled with nitrogen. The center substrate of the 50 substrates was monitored for deposition rate, deposited film refractive index, and film uniformity. To make these measurements, a Rudolph research ellipsometer was employed to determine index of refraction, and a Nanometrics, Incorporated NanoSpec/AFT optical gauge was utilized to monitor film thickness. The deposition was continued until a thickness of approximately 1 $\mu$m was achieved. The measured deposition rate was approximately 26 Angstroms/minute, yielding an about 1560-Angstrom thick layer having a uniformity of approximately ±5 percent across the substrate.

EXAMPLE 2

The procedure of Example 1 was followed except a DADBS flow of 5 sccm was utilized, together with a flow of 5 sccm of oxygen. The oxygen was introduced through a mass flow meter directly into the deposition chamber. The pumping speed was adjusted so that the combined flow of oxygen and DADBS yielded a reactor pressure of 0.6 Torr and a deposition rate of 23 Angstroms/minute.

EXAMPLE 3

A series of runs, following either the procedure of Example 1, or when oxygen was introduced, following the procedure of Example 2, was made. The conditions utilized for these runs are shown in the Table. When DADIS or TBES was utilized (each purchased from Petrarch Systems, Inc.), this compound was employed in the round-bottom flask rather than the DADBS. A substrate temperature of 410 degrees C. was achieved by holding the second and third zones at 410 degrees C. and by utilizing only 25 substrates held in the back half (as measured in the direction of gas flow) of the substrate holder. To obtain temperatures other than 410 degrees C. or 450 degrees C., each zone was held at the same temperature. Thus, for example, for 500 degrees C., each zone was held at 500 degrees C. The results are indicated in the Table.

EXAMPLE 4

A tubular, three-zone reactor furnace having an interior diameter of approximately 2.5 inches was heated as each zone was set to temperature of 525 degrees C. so as to produce an essentially uniform, constant-temperature zone having a length of approximately 70 centimeters. A quartz sample holder was loaded with 50 silicon wafer substrates having their major plane in the <100> crystallographic direction; the substrates were placed back-to-back in pairs spaced approximately 2 cm apart and centered in the uniform temperature zone with their major surfaces perpendicular to the axis of the furnace. The furnace was evacuated to a pressure of approximately 0.03 Torr and brought to temperature. Oxygen was fed into one end of the reactor at a rate sufficient to raise the total pressure to approximately 0.15 Torr. A mixture of approximately 44.3 percent DABDS, 7.5 percent TMP, and 48.2 percent TMB by volume was pumped into an ante-chamber portion of the reactor at a rate of approximately 5 milliliters per hour. The mixture was flash-evaporated in the ante-chamber by localized heating, and the resulting vapor stream was passed over the substrates. After two hours the flows of liquid and oxygen were stopped, the furnace was allowed to cool and, at room temperature, the vacuum was released. Inspection of the wafers showed a uniform deposit for all wafers suitable within the central 30 cm of the furnace during deposition; for these wafers, thickness variation across a wafer was within ±2 percent, and average thickness of the deposited layers was 2.34±0.24 micrometers. The composition of these films was found to be approximately 9 percent $P_2O_5$, 13 percent $B_2O_3$, and 78 percent $SiO_2$ by weight. Coverage was essentially conformal across trenches and steps present on several of the substrates.

TABLE

| Source | Substrate Temp., °C. | Silicon Oxide Deposition | | | | |
|---|---|---|---|---|---|---|
| | | Flow, sccm | | Reactor Press., Torr | Deposition Rate, Å/min, On Middle Substrate | Deposition Times (Min) |
| | | Source | Oxygen | | | |
| DADBS | 410 | ~8 | 0 | 1.0 | 23 | 30 |
| | | ~8 | 0 | 1.2 | 36 | 30 |
| | 450 | ~8 | 0 | 0.7 | 26 | 30 |
| | | ~5 | 0 | 0.9 | 27 | 30 |
| | | ~5 | 5 | 0.6 | 23 | 30 |
| | | ~5 | 10 | 0.7 | 26 | 30 |
| | | ~5 | 15 | 0.6 | 19 | 60 |
| | 500 | ~8 | 0 | 0.7 | 56 | 30 |
| | | ~5 | 0 | 1.1 | 28 | 30 |
| | | ~10 | 10 | 0.7 | 57 | 30 |
| | 550 | ~5 | 0 | 0.4 | 126 | 30 |
| | | ~10 | 0 | 0.7 | 100 | 30 |
| DADIS | 500 | ~5 | 0 | 0.7 | 5 | 100 |
| | 550 | ~5 | 0 | 0.7 | 17 | 60 |
| | 600 | ~5 | 0 | 0.7 | 36 | 30 |
| TBES | 500 | ~5 | 0 | 0.7 | 3 | 180 |
| | 550 | ~8 | 0 | 0.7 | 17 | 60 |
| | | ~8 | 10 | 0.7 | 13 | 60 |
| | 600 | ~5 | 0 | 0.7 | 10 | 90 |

What is claimed is:

1. A process for forming a device including a region of a material which comprises a silicon oxide, said process comprising the steps of subjecting a substrate to an environment into which a gas stream is introduced, and inducing a reaction that leads to deposition of said material n said substrate, said gas stream comprising
   (i) a composition selected from the group consisting of diacetoxyditertiarybutoxysilane (DADBS), diacetoxydiisopropoxysilane (DADIS), and tritertiarybutoxyethoxysilane (TBES), and
   (ii) an additive selected form the group consisting of organophosphites, organophosphates and organoborates, wherein said deposition is induced at a temperature less than 600 degrees C., and whereby said deposition has a conformance of at least 0.9.

2. The process of claim 1 in which said organoderivative is trimethyl phosphite (TMP).

3. The process of claim 1 in which said organoderivative is trimethyl borate (TMB).

4. The process of claim 1 in which said material is a silicate glass comprising silicon oxide in an amount of at least 50 weight percent.

5. The process of claim 4 in which said silicate glass comprises boron oxide.

6. The process of claim 4 in which said silicate glass comprises phosphorus oxide.

7. The process of claim 4 in which said silicate glass comprises boron oxide and phosphorus oxide.

8. The process of claim 7 in which said silicate glass comprises $B_2O_3$ in an amount in the range of from 3 to 26 weight percent, and $P_2O_5$ in an amount in the range of from 2 to 18 weight percent, remainder essentially $SiO_2$.

9. The process of claim 1 in which making said gas stream comprises flash-evaporating a mixture of liquids.

10. The process of claim 1 in which making said gas stream comprises mixing of gases.

11. The process of claim 1 in which said substrate comprises lithium niobate.

12. The process of claim 1 in which said substrate comprises silicon.

13. The process of claim 1 in which inducing said reaction involves producing a discharge in said mixture of gases.

14. The process of claim 1 in which inducing said reaction involves heating said substrate.

15. The device made by the process in accordance with claim 1.

* * * * *